June 6, 1967 D. SHEFFET 3,324,415

FREQUENCY AND AMPLITUDE STABILIZED RC COUPLED OSCILLATOR CIRCUIT

Filed Jan. 8, 1965

INVENTOR
DAVID SHEFFET,
By His Attorneys
Spensley & Horn.

3,324,415
Patented June 6, 1967

3,324,415

FREQUENCY AND AMPLITUDE STABILIZED RC COUPLED OSCILLATOR CIRCUIT

David Sheffet, Altadena, Calif., assignor to Western Geophysical Co. of America, Los Angeles, Calif., a corporation of Delaware Filed Jan. 8, 1965, Ser. No. 424,353
10 Claims. (Cl. 332—26)

Figure 1:
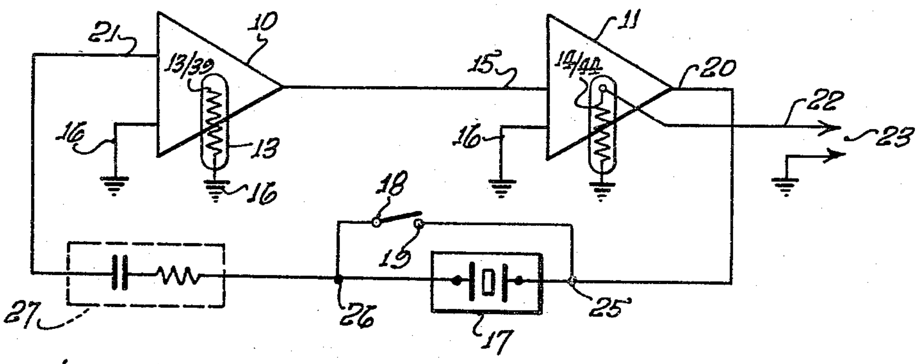

This invention relates to oscillators and more particularly to a transistor oscillator circuit wherein both the amplitude and the frequency of the oscillations thereof are maintained with great stability despite variations in temperature and which may employ quartz crystal frequency determining elements over a wide range of frequencies, the oscillator circuit being operable at a particular crystal frequency even when the crystal is shorted, and the frequency also being variable about said particular crystal frequency by electrical or mechanical means.

In the prior art a variety of crystal-controlled oscillator circuits have been described. These generally break down into self-excited crystal oscillator circuits where no particular frequency determining elements other than the crystal are used; circuits in which inductance and capacity elements are employed to tune the circuit to the crystal frequency at which frequency the crystal holds the circuit in oscillation within the limits of the temperature coefficient of frequency of the crystal unit; and circuits in which the crystal acts as a resonator in a feedback path from some part of the output circuit thereof to some part of the input circuit of the oscillator.

In none of these circuits is it possible to cause the oscillator to continue to oscillate in the absence of the crystal unless some comparable resonant network is substituted therefor.

When it is necessary to operate such prior art oscillator circuits employing crystal frequency determining elements over a wide range of temperatures it has been the practice to encase the crystal in the thermostatically controlled environment at some particular temperature. For each crystal at a different frequency a separate temperature-controlled oven is required since the crystal and oven structure are generally an integral unit.

The frequency modulation of crystal-controlled oscillators has been described in the prior art, but circuits to accomplish this are extremely complex and require a great many components.

This invention contemplates an improved and relatively simple crystal-controlled oscillator circuit which, once adjusted, will receive crystals over a wide range of frequencies and maintain the amplitude and frequency of the oscillator circuit constant over a substantial temperature range. A feature of the novel oscillator of this invention is the provision of means to permit, after adjustment for a particular crystal, the circuit to continue to oscillate as a self-excited oscillator at the crystal frequency, even when the crystal has been electrically shorted out of the circuit. By electrical or mechanical variation of the adjustment means, above mentioned, the oscillator can be varied in frequency about the crystal frequency with the oscillator operating in the self-excited state.

The novel oscillator above described uses no inductance element tuned by capacity but employs transistors or vacuum tubes as the active elements, and will oscillate over a wide range of crystal frequencies with great stability both in amplitude and frequency of oscillation without requiring any tuning readjustment as different crystals are installed therein. The combined stability of amplitude and frequency of the oscillator circuit of this invention over such wide temperature and frequency ranges is presently unknown in the art of transistorized oscillator circuits.

It is accordingly an object of this invention to provide a versatile, highly stable transistorized crystal-controlled oscillator circuit.

It is another object of this invention to provide a highly stable transistor oscillator circuit which may be operated as a crystal-controlled or self-excited oscillator at the crystal frequency and wherein the frequency may be varied mechanically or electrically about the crystal frequency when self-excited.

It is a further object of this invention to provide a transistorized crystal oscillator circuit in which the crystal is a feedback element in an oscillator circuit comprising a pair of temperature stabilized amplifiers in cascade to achieve a high degree of temperature and amplitude stability in the oscillations thereof.

It is an even further object of the invention to provide a crystal-controlled oscillator circuit employing transistors wherein temperature stabilization and stabilization of frequency and amplitude of oscillation are very closely controlled to provide an extremely high degree of oscillator stability over a wide range of frequencies and temperatures.

And it is still another object of this invention to provide a crystal-controlled oscillator in which the crystal may be shorted and the oscillator still maintain oscillation at the crystal frequency, the oscillator being variable about this frequency by electrical or mechanical means, wherein the temperature stability with respect to amplitude of oscillation will be constant.

The novel features which are believed to be characteristic of the present invention, together with objects and advantages thereof, will be better understood from the following description considered in connection with the accompanying drawings in which the invention is illustrated by way of example. It is to be expressly understood, however, that this description and the drawings are for the purposes of illustration and description only, and that the true spirit and the scope of the invention is defined by the accompanying claims.

Figure 2:
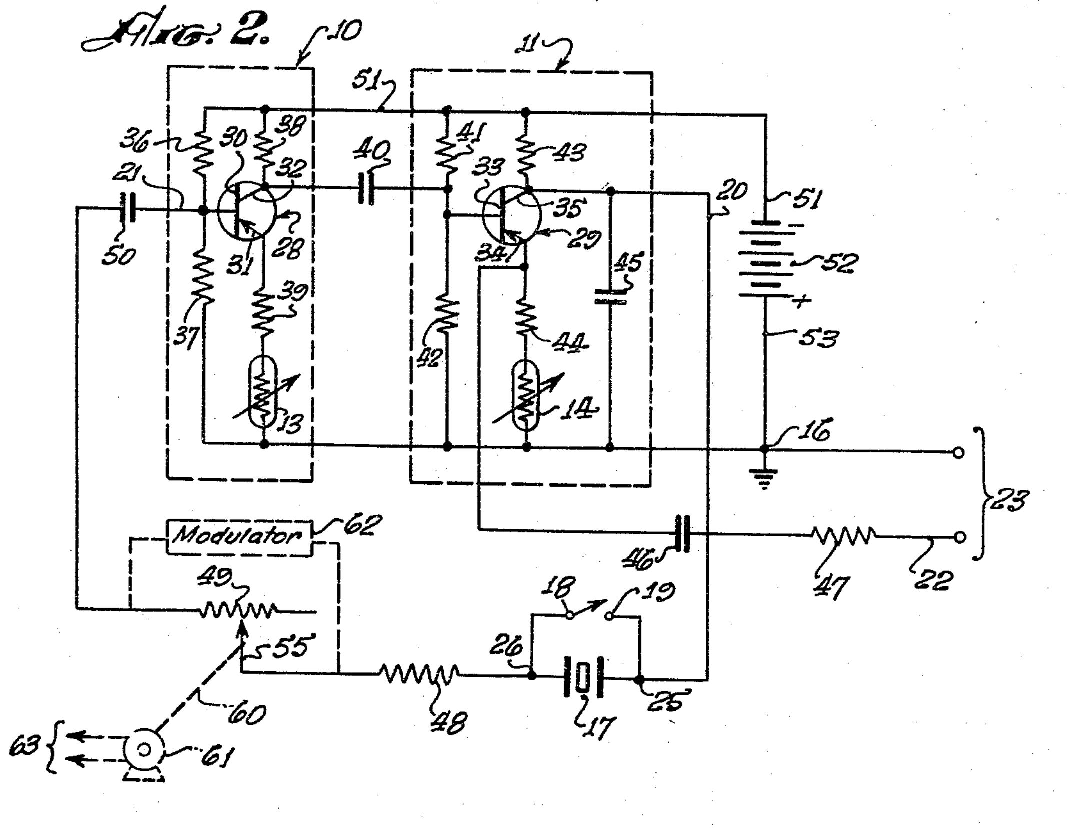

In the drawings:

FIGURE 1 is a block diagram of the presently preferred embodiment of this invention, showing the essential elements thereof; and FIGURE 2 is a schematic circuit diagram of the presently preferred embodiment of this invention.

In the block diagram shown in FIGURE 1, the essential features of the invention are shown. A first amplifier 10 is coupled as shown by lead 15 and ground 16 to a second amplifier 11. Each of amplifiers 10 and 11 has a respective temperature sensitive resistance element 13, 14 in the ground return portion thereof. Amplifier 11 has two output circuits at 20 and at 22, respectively. The output 20 is connected to one terminal 25 of element 17 which may be a frequency determining element such as a quartz crystal oscillator plate. The other output connection 22 goes to the signal output load circuit 23 comprising lead 22 and ground 16.

The other terminal 26 of frequency determining element 17 is connected to input circuit 21 of amplifier 10 through a resistance-capacitance network 27. Thus element 17 is connected between the input 21 of the first amplifier stage 10 of a two stage cascade amplifier and the output 20 of the second amplifier stage 11 of the cascade amplifier comprising amplifiers 10 and 11.

A single pole normally open switch 18–19 is connected between the two terminals 25 and 26 of element 17. Switch 18–19 may be closed to short out the frequency determining element 17.

The basic operation of the invention can be understood from the block diagram of FIGURE 1. A pair of temperature stabilized amplifiers 10–11 are connected in a cascade circuit arrangement. Each of the stabilized amplifiers is generally in accordance with amplifiers described in my co-pending application Ser. No. 145,036 filed Oct. 16, 1961, entitled, "Geophysical Amplifier." A frequency determining network consisting of a quartz crystal element 17 and a resistance-capacitance coupling network 27 is connected between the output 20 of the second amplifier 11 of the cascade amplifier 10–11 and the input 21 of the first amplifier 10.

In the amplifiers 10–11, the temperature stabilization thereof is accomplished with an element generally described as a Sensistor as indicated at 13–14 of FIGURE 1. The Sensistor is a device which varies in its impedance or resistance with the temperature of its environment. The Sensistor can be chosen so as to correct for the amplitude or output variation of transistor amplifier due to thermal action thereon. The direction of the variation in amplitude is inversely related to the impedance variation of the Sensistor in such fashion that the loss or increase in gain which may result from thermal action on the transistor such as 28 or 29 used in an amplifier configuration such as 10 or 11 will be overcome because a comparable variation in the transistor operating conditions will be accomplished by the concurrent change of the impedance of the Sensistor due to the same thermal effect on the Sensistor as used herein is connected into an appropriate circuit portion of the amplifier wherein this compensatory action is effective. The gain of the cascade transistor amplifier 10–11 is therefore extremely stable over a wide range of temperatures.

The circuit diagram of FIGURE 2 shows the stabilized oscillator circuit of this invention in greater detail in a practical embodiment thereof.

In the circuit of FIGURE 2 transistor 28 has a base 30, an emitter 31, and a collector 32. Transistor 29 has a base 33, an emitter 34, and a collector 35.

A resistor 36 is connected between base 30 of transistor 28 and a source of negative potential 51 with respect to ground. A resistor 37 is connected between base 30 and ground 16. Resistors 36 and 37 form a base-biasing voltage divider for base 30. Resistor 38 is the output load resistor connected between collector 32 of transistor 28 and negative potential line 51. Resistor 39 is connected between emitter 31 and one end of temperature sensitive resistance element 13, the other end of which is connected to ground. Thus resistor 39 in series with temperature sensitive resistor 13 forms the emitter-biasing resistance for transistor 28. The emitter resistors 39 and 13 and the base-biasing resistors 36 and 37 act in combination to produce the highly stable amplifier gain over a wide range of temperature as disclosed in the above mentioned co-pending application. Transistor 28 and resistors 36, 37, 38, 39, and 13 make up temperature-stabilized amplifier 10.

The collector 32 of transistor 28 is coupled by a capacitor 40 to the base 33 of second transistor 29. In a similar manner to that described above for transistor 28, the resistors 41 and 42 form a base-biasing, voltage-divider network for transistor 29. Resistor 43 is the collector load for transistor 29 and resistor 44 is connected between emitter 34 and temperature sensitive resistance element 14. As with transistor 28 the corresponding resistances 41, 42, 44, and 14 provide the gain stabilization action for transistor 29 as above described in accordance with my co-pending application, Ser. No. 145,036. Transistor 29 with resistors 41, 42, 43, 44, and 14 comprise temperature-stabilized amplifier 11.

It should be noted here that while the transistors 28–29 shown in the circuit of FIGURE 2 are PNP types, NPN types may be used as well, in which case the polarity of battery 52 is reversed.

A capacitor 45 is connected from collector 35 to ground 16. The function of capacitor 45 is further defined below. An output coupling capacitor 46 is connected from emitter 34 of amplifier 11 to one end of an output load isolation resistor 47. The output terminal of the oscillator is at 22 at the other end of resistor 47. A load or utilization device may be connected at 23 between output terminal 22 and ground 16.

A crystal oscillator element 17 is connected from collector 35 of transistor 29 by line 20 to one end of a fixed resistor 48, the other end of which is connected to the variable arm 55 of a variable resistor 49. Resistor 49 is connected in a rheostat configuration to one end of a capacitor 50, the other end of which is connected to base 30 of transistor 28.

Capacitor 45 serves a wave-shaping function in the crystal-controlled oscillator operation of the circuit and both a waveshaping and a frequency-determining function in the self-excited mode of operation of the oscillator. The oscillator can be placed in the latter mode by the closing of normally-open switch 18–19 connected across the terminals 25–26 of crystal unit 17. This results in the shorting out of crystal 17 and the frequency of the oscillator circuit of this invention becomes dependent upon capacitor 45 in combination with resistors 48, 49, and capacitor 50. In the latter mode, therefore, capacitor 45 controls both frequency and waveshape of the resulting oscillations. The capacitor 45 serves as an integrator when used in the shunt connection between the collector 35 and ground. Because of the larger amount of feedback from collector 35 to the base 30 of transistor 28, the waveform generally has a large amount of distortion. Capacitor 45 serves to greatly reduce this distortion by acting as a crude high-cut filter.

The output of temperature stabilized amplifier stage 11 at collector 35 feeds back through crystal unit 17, fixed resistor 48, variable resistor 49, and capacitor 50 to the input at the base 30 of temperature stabilized amplifier stage 10. The crystal-controlled oscillations will occur at the natural crystal frequency over a wide range of values of resistors 48 and 49 and capacitor 50. The setting of resistor 49 by its arm 55 need only be sufficient to limit the crystal vibration amplitude to a safe level at which the crystal will not shatter. The oscillaions are then held constant at this amplitude over a wide range of crystal frequencies without any further readjustment of the circuit. This is not possible with crystal oscillators involving the use of inductance and capacitance as frequency resonating elements in a crystal-controlled oscillator.

With any particular crystal the setting of variable resistor 49 has no effect on the frequency of oscillation and but slight influence on the output amplitude of the resulting oscillation appearing at the output load circuit 23. However when switch 18–19 is closed, thereby shorting crystal 17, the adjustment of variable resistor 49 can then be made to set the now self-excited oscillator to the same frequency as the crystal frequency or to a wide range of frequencies above and below the crystal frequency.

In dotted line form there are shown in FIGURE 2 two means whereby in the self-excited mode of operation, described above, the oscillator frequency may be varied about the frequency to which the oscillator had been set by resistor 49. At 61 in FIGURE 2 a schematic motor is shown mechanically coupled by link 60 to arm 55 of variable resistor 49. When motor 61 is connected to a source of power as at 63 it may be made to rotate arm 55 and thereby vary the frequency of the oscillator over a range about the setting of resistor 49. Alternatively, motor 61 may be equipped to oscillate the arm back and forth via link 60 to produce frequency modulation.

As a further alternative, a modulator, identified at 62, may be connected across the terminals of resistor 49, so as to provide a parallel impedance thereacross. The impedance may be a transistor circuit driven from a source of alternating or otherwise varying potential to provide a variable parallel impedance or resistance across resistor 49 thereby to vary the effective resistance of the parallel combination and produce a frequency varying oscillations in accordance with these impedance variations.

In typical units constructed according to this invention as hereinabove set forth, oscillators operating over a frequency range of 3 to 1 have been maintained with the stability desired within a temperature range of −40° Fahrenheit to +140° Fahrenheit when a resistor such as 49 is used having an impedance of 20,000 ohms.

What is claimed is:

1. An amplitude and frequency stabilized RC coupled oscillator circuit comprising:

a first temperature-stabilized amplifier means;

a second temperature-stabilized amplifier means coupled to said first temperature stabilized amplifier means to form a two-stage cascade temperature-stabilized amplifier therewith;

a frequency selective means including a frequency controlling and adjusting means coupled between the output of said second amplifier means and the input of said first amplifier means in regenerative relation whereby said cascade amplifier oscillates stably at the frequency of said frequency controlling means of said frequency controlling means of said frequency selective means, said frequency adjusting means including a series coupled resistance means and capacitance means; and switching means disposed across said frequency controlling portion of said frequency selective means for shorting-out said frequency controlling portion of said frequency selective means, said oscillator circuit then being settable by said resistance means to continue to oscillate at the frequency of said frequency controlling means, said frequency of oscillation being variable by adjustment of said resistance means.

2. The oscillator circuit defined in claim 1 wherein a modulator is connected across at least a portion of said resistance means to automatically modulate the frequency of said oscillator.

3. An amplitude and frequency stabilized oscillator comprising:

a first transistor having a base, a collector and an emitter;

a second transistor having a base, a collector and an emitter;

a source of direct-current potential having a negative and a positive terminal;

a first and a second base biasing network each respectively connected across said source of direct-current potential and each said base biasing networks having a respective tap thereon connected to a respective one of said bases of said first and said second transistors to supply thereto a predetermined forward base bias;

a first and a second collector load resistor each connected respectively between a respective collector of said first and said second transistors and a predetermined one of said terminals of said source of direct-current potential to provide a voltage to said transistors;

a first coupling capacitor connected between said collector of said first transistor and said base of said second transistor;

a first emitter stabilizing network comprising a first emitter resistor and a Sensistor connected in series, said first emitter resistor connected to said emitter of said first transistor and said first Sensistor connected to the other terminal of said source of direct-current potential.

a second emitter stabilizing network comprising a second emitter resistor and a Sensistor connected in series, said second emitter resistor connected to said emitter of second transistor and said second Sensistor connected to said other terminal of said source of direct-current potential, said first and said second emitter stabilizing networks being responsive to the temperature changes in the environment of said oscillator to maintain the collector and base currents of said first and said second transistors relatively constant and thereby to stabilize the gain of said transistors over a wide range of temperature variation of said environment;

an output waveshaping capacitor connected between said collector of said second transistor and said other terminal of said source of direct-current potential;

an output terminal;

an output coupling network comprising a capacitor and a load limiting resistor connected in series between said emitter of said second transistor and said output terminal; and a regenerative coupling network connected between said collector of said second transistor and said base of said first transistor, said regenerative coupling network comprising a series circuit including a crystal oscillator resonant at a predetermined frequency, said crystal oscillator having a normally open switch connected thereacross, a fixed resistor, a variable resistor and a second coupling capacitor, whereby said oscillator oscillates in a first mode at a frequency determined by and accurately stabilized by said crystal when said switch thereacross is open, and in a second mode at a corresponding frequency settable by said variable resistor acting in conjunction with said waveshaping capacitor and said second coupling capacitor when said switch is closed thereby shorting out said crystal, the amplitude of oscillation in either mode of oscillation being maintained constant with respect to changes in temperature of the environment by said emitter stabilizing networks, the oscillations of said oscillator being applied to said output terminal.

4. The oscillator defined in claim 3 wherein said first and second transistors are PNP transistors and said one terminal of said source of direct-current potential is said negative terminal and said other terminal thereof is said positive terminal thereof.

5. The oscillator defined in claim 3 wherein an electronic device is connected in parallel with said variable resistor in said second mode of said oscillator to modulate said oscillator about said oscillation frequency.

6. The oscillator defined in claim 3 wherein said variable resistor is connected to a mechanical oscillator in said second mode of said oscillator which varies the resistor mechanically to modulate said oscillator in accordance with the oscillations of said mechanical oscillator.

7. An amplitude and frequency stabilized RC coupled oscillator circuit comprising:

a first temperature-stabilized amplifier means;

a second temperature-stabilizer amplifier means coupled to said first temperature stabilized amplifier means to form a two-stage cascade temperature-stabilized amplifier therewith;

a frequency selective means including a frequency controlling and adjusting means coupled between the output of said second amplifier means and the input of said first amplifier means in regenerative relation whereby said cascade amplifier oscillates stably at the frequency of said frequency controlling means of said frequency selective means, said frequency adjusting means including series coupled resistance means and capacitance means; and switching means disposed across said frequency controlling portion of said frequency selective means for shorting-out said frequency controlling portion of said frequency selective means, said oscillator circuit then being settable by said resistance means to continue to oscillate at the frequency of said frequency controlling means, said frequency of oscillation being variable by adjustment of said resistance means, said frequency of said oscillator remaining constant independently of the resistance of said adjustment means when said switching means is not shorting out said frequency controlling portion of said frequency selective means.

8. An amplitude and frequency stabilized RC coupled oscillator having a pair of output terminals comprising:

a first transistor means having an input electrode, an output electrode and a common electrode;

a second transistor means having an output electrode, an input electrode and a common electrode, each of said transistors having their common electrodes coupled to one of the output terminals of said oscillator;

a first coupling capacitor connected between the output electrode of said first transistor means and the input electrode of said second transistor means;

a first temperature stabilizing means coupled between said one output terminal of said oscillator and the common electrode of said first transistor means;

a second temperature stabilizing means coupled to said one output terminal of said oscillator and the common electrode of said second transistor means, said first and said second temperature stabilizing means being responsive to the temperature changes in the environment of said oscillator to maintain the gain of said first and said second transistor means relatively constant over a wide range of temperature variation of said environment;

an output integrating capacitor being coupled intermediate the output electrode of said second transistor means and said one output terminal of said oscillator;

an output coupling network comprising a capacitor and a load limiting resistor coupled in series between the common electrode of said second transistor means and the other said output terminals of said oscillator; and a regenerative coupling network, coupled between the output electrode of said second transistor means and the input electrode of said first transistor means, said regenerative coupling network comprising a series circuit including a crystal resonant at a predetermined frequency, said crystal having a normally-open switch connected thereacross, a fixed resistor, a variable resistor and a second coupling capacitor, whereby said oscillator oscillates in a first mode at a frequency determined by and accurately stabilized by said crystal when said switch thereacross is open, and in a second mode at a corresponding frequency settable by said variable resistor acting in conjunction with said integrating capacitor and said second coupling capacitor when said switch is closed, thereby shorting out said crystal, the amplitude of oscillation in either mode of oscillation being maintained constant with respect to changes in temperature of the environment by said temperature stabilizing networks.

9. An amplitude and frequency stabilized RC coupled oscillator having a pair of output terminals comprising:

a first transistor means having an input electrode, an output electrode and a common electrode;

a second transistor means having an output electrode, an input electrode and a common electrode, each of said transistors having their common electrodes coupled to one of the output terminals of said oscillator;

a first coupling capacitor connected between the output electrode of said first transistor means and the input electrode of said second transistor means;

a first temperature stabilizing means coupled between said one output terminal of said oscillator and the common electrode of said first transistor means;

a second temperature stabilizing means coupled to said one output terminal of said oscillator and the common electrode of said second transistor means, said first and said second temperature stabilizing means being responsive to the temperature changes in the environment of said oscillator to maintain the gain of said first and said second transistor means relative constant over a wide range of temperature variation of said environment;

an output integrating capacitor being coupled intermediate the output electrode of said second transistor means and said one output terminal of said oscillator;

an output coupling means; and a regenerative coupling network between the output electrode of said second transistor means and the input electrode of said first transistor means, said regenerative coupling network comprising a series circuit including a crystal resonant at a predetermined frequency, a fixed resistor, a variable resistor and a second coupling capacitor, whereby said oscillator oscillates in a mode at a frequency determined by and accurately stabilized by said crystal, the amplitude of oscillation being maintained constant with respect to changes in temperature of the environment by said temperature stabilizing networks.

10. An amplitude and frequency stabilized RC coupled oscillator having a pair of output terminals comprising:

a first transistor having an input electrode, an output electrode and a common electrode;

a second transistor having an output electrode, an input electrode and a common electrode, each of said transistors having their common electrodes coupled to one of the output terminals of said oscillator;

a first coupling capacitor connected between the output electrode of said first transistor and the input electrode of said second transistor;

a first temperature stabilizing network including a first Sensistor coupled between said one output terminal of said oscillator and the common electrode of said first transistor;

a second temperature stabilizing network including a second Sensistor coupled to said one output terminal of said oscillator and the common electrode of said second transistor;

said first and said second temperature stabilizing networks being responsive to the temperature changes in the environment of said oscillator to maintain the gain of said first and said second transistors relatively constant and thereby to stabilize the output of said oscillator over a wide range of temperature variation of said environment;

an output integrating capacitor being coupled intermediate the output electrode of said second transistor and said one output terminal of said oscillator;

an output coupling network comprising a capacitor and a load limiting resistor coupled in series between the common electrode of said second transistor and the other of said output terminals of said oscillator; and a regenerative coupling network coupled between the output electrode of said second transistor and the input electrode of said first transistor, said regenerative coupling network comprising a series circuit including a fixed resistor, a variable resistor and a second coupling capacitor, whereby said oscillator oscillates in a mode at a frequency settable by said variable resistor acting in conjunction with said integrating capacitor and said second coupling capacitor, the amplitude of oscillation being maintained constant with respect to changes in temperature of the environment by said temperature stabilizing networks.

References Cited

UNITED STATES PATENTS

| | | | |
|---|---|---|---|
| 2,439,245 | 4/1948 | Dunn | 331—140 |
| 3,196,357 | 7/1965 | Hoag | 331—59 X |
| 3,217,269 | 11/1965 | Rowley et al. | 331—116 X |
| 3,239,776 | 3/1966 | Shaw | 331—183 |
| 3,277,398 | 10/1966 | Brigham | 331—141 |

FOREIGN PATENTS

| | | |
|---|---|---|
| 239,136 | 10/1959 | Australia. |
| 964,031 | 7/1964 | Great Britain. |

OTHER REFERENCES

Collins: "Temperature Sensitive Devices," Electronics World, October 1964, pp. 50–52.

Silverman: "Voltage Variable Silicon Capacitors," CQ, February 1961, pp. 40, 41.

Handbook of Piezoelectric Crystals for Radio Equipment Designers, Report 54–248 of Wright Air Development Center, December 1954, p. 254.

ROY LAKE, *Primary Examiner.*

J. B. MULLINS, *Assistant Examiner.*